(12) United States Patent
Shimazu

(10) Patent No.: US 8,172,945 B2
(45) Date of Patent: May 8, 2012

(54) HIGH-PURITY VITREOUS SILICA CRUCIBLE FOR PULLING LARGE-DIAMETER SINGLE-CRYSTAL SILICON INGOT

(75) Inventor: Atushi Shimazu, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 755 days.

(21) Appl. No.: 12/325,014

(22) Filed: Nov. 28, 2008

(65) Prior Publication Data

US 2009/0151624 A1 Jun. 18, 2009

(30) Foreign Application Priority Data

Dec. 14, 2007 (JP) ................. P2007-323419

(51) Int. Cl.
*C30B 15/10* (2006.01)
(52) U.S. Cl. .......... 117/208; 117/200; 117/213; 117/13; 117/900
(58) Field of Classification Search ................. 117/208, 117/200, 213, 13, 900
See application file for complete search history.

(56) References Cited

U.S. PATENT DOCUMENTS

| | | | |
|---|---|---|---|
| 3,972,704 A * | 8/1976 | Loxley et al. .................. 65/157 |
| 4,612,973 A * | 9/1986 | Whang ......................... 164/508 |
| 5,306,473 A * | 4/1994 | Nakajima et al. ............. 117/208 |
| 6,200,385 B1 * | 3/2001 | Swinehart ..................... 117/220 |
| 6,548,131 B1 * | 4/2003 | Fabian et al. ................. 428/34.4 |
| 2004/0187771 A1 * | 9/2004 | Tsuji et al. .................... 117/220 |

FOREIGN PATENT DOCUMENTS

| | | |
|---|---|---|
| JP | 06-092779 | 4/1994 |
| JP | 06-92779 | 4/1994 |
| JP | 7-42193 | 5/1995 |
| JP | 2000-169283 | 6/2000 |
| JP | 2005-272178 | 10/2005 |
| JP | 2005-298288 | 10/2005 |

OTHER PUBLICATIONS

Machine translation and original the Oyama, JP2005-170776, Jun. 30, 2005.*
Koller, WO 02/0166915, 2002.*
English Language Abstract of JP2000-169283, 2000.
English Language Abstract of JP 7-42193, 1995.
English Language Abstract of JP06-92779, 1994.
U.S. Appl. No. 12/303,140, filed Dec. 2, 2008, and entitled "Vitreous Silica Crucible, Method of Manufacturing the Same, and Use Thereof".
English language translation of patent abstract 2005-272178.
English language translation of patent abstract 2005-298288.

* cited by examiner

*Primary Examiner* — Matthew Song
(74) *Attorney, Agent, or Firm* — Greenblum & Bernstein, P.L.C.

(57) ABSTRACT

A high-purity vitreous silica crucible used for pulling a large-diameter single-crystal silicon ingot, includes a double layered structure constituted by an outer layer composed of high-purity amorphous vitreous silica with a bubble content of 1 to 10% and a purity of 99.99% or higher, and an inner layer composed of high-purity amorphous vitreous silica s with a bubble content of 0.6% or less and a purity of 99.99% or higher, wherein, at least for an inner surface of the vitreous silica crucible between ingot-pulling start line and ingot-pulling end line of a silicon melt surface, a longitudinal section of the inner surface is shaped into a waveform, and depth and width of the ring grooves constituting the multi ring-groove patterned face are set in the range of 0.5 to 2 mm and 10 to 100 mm, respectively.

2 Claims, 5 Drawing Sheets

HIGH-PURITY VITREOUS SILICA CRUCIBLE FOR PULLING LARGE-DIAMETER SINGLE-CRYSTAL SILICON INGOT

BACKGROUND OF THE INVENTION

1. Field of the Invention

The present invention relates to a high-purity vitreous silica crucible used for pulling a single-crystal silicon ingot for semiconductors. More particularly, the present invention relates to a high-purity vitreous silica crucible (hereinafter, simply referred to as vitreous silica crucible) capable of reducing a SiO captured in a large-diameter single-crystal silicon ingot (hereinafter, simply referred to as single-crystal ingot) from a silicon melt (molten silicon), thereby significantly reducing pinhole defects in the single-crystal ingot caused by the SiO gas.

Priority is claimed on Japanese Patent Application No. 2007-323419, filed on Dec. 14, 2007, the content of which is incorporated herein by reference.

2. Description of Related Art

Conventionally, in order to manufacture a vitreous silica crucible, as illustrated by longitudinal sectional views in FIG. 3A and FIG. 3B, as a raw powder, high-purity vitreous silica powder with an average particle size of 200 to 300 μm and a purity of 99.99% or higher is used. In addition, a gap formed between an inner surface of a graphite mold 310 and an outer surface of a core 316, for example, a gap of 30 mm, is filled with the high-purity vitreous silica powder 315 while the graphite mold is rotated at a speed of 60 to 80 rpm (see FIG. 3A). After filling the gap, the core is removed, and while the graphite mold is rotated at a speed of 50 to 100 rpm, a three-phase AC arc discharger (arc electrodes 312) using graphite electrodes is inserted through an upper opening. Here, the graphite mold is heated to a temperature of about 2,000° C. by vertically reciprocating the arc electrodes 312 with respect to the inner surface of the graphite mold. In addition, a vacuum is created inside the graphite mold 310 through a ventilation passage which is open to the inner surface of the graphite mold 310, and the raw powder is melted and solidified. It is known that by performing the aforementioned operations, a vitreous silica crucible with a thickness of, for example, 10 mm is manufactured (see FIG. 3B).

In addition, it is also known that the vitreous silica crucible obtained as a result has a double layered structure constituted by an outer layer composed of high-purity amorphous vitreous silica with a bubble content (percentage of bubbles included in vitreous silica per unit volume) of 1 to 10% and a purity of 99.99% or higher and an inner layer composed of high-purity amorphous vitreous silica with a bubble content of 0.6% or less and a purity of 99.99% or higher, and a ratio in thickness between the inner layer and the outer layer is generally 1:1 to 5 (for example, see FIG. 1A).

In addition, a single-crystal ingot is manufactured by, as illustrated by a longitudinal sectional view in FIG. 4, a step of supplying high-purity polysilicon mass to a vitreous silica crucible 100 fixed to a graphite support 411, a step of melting the polysilicon mass by using a heater provided along an outer circumference of the graphite support so as to be converted into a silicon melt, a step of heating the silicon melt and maintaining the predetermined temperature in the range of 1,500 to 1,600° C. while rotating the vitreous silica crucible, and a step of dipping a silicon seed crystal into the silicon melt surface while rotating the silicon seed crystal in an Ar gas atmosphere under reduced pressure and pulling the silicon seed crystal. This manufacturing method is called the CZ (Czochralski) method.

In addition, in the manufacturing of the single-crystal ingot, as also illustrated in FIG. 4, the silicon melt moves from a lower portion of the single-crystal ingot toward a lower portion of the crucible in the vitreous silica crucible, and flows upward from the lower portion of the crucible along an inner surface of the crucible, by convection flowing toward the lower portion of the single-crystal ingot. Meanwhile, the silicon (Si) melt reacts with the inner surface ($SiO_2$) of the crucible to generate SiO gas. The generated SiO gas moves along with the flow of the silicon melt toward the silicon melt surface and is discharged to the pressure-reduced Ar gas atmosphere and removed. In this case, so as not to enable the generated SiO gas to move into the single-crystal ingot under pulling and generate pinhole defects in wafers, the pulling condition is controlled (see JP-B-7-42193 and JP-A-2000-169283).

Recently, as the demand for increasing the size of single-crystal ingots increases, accordingly large-diameter single-crystal ingots with diameters of 200 to 300 mm have been increasingly manufactured. However, as the diameter of the single-crystal ingot increases, the diameter of the vitreous silica crucible correspondingly needs to be increased. In order to pull the single-crystal ingot with the diameter of 200 to 300 mm, a vitreous silica crucible with an outer diameter of 610 to 810 mm is needed. As a result, an area where the silicon melt and the inner surface of the vitreous silica contact with each other increases during the pulling operation. Accordingly, the amount of the generated SiO gas significantly increases. However, it is difficult to discharge the large amount of the generated SiO gas from the silicon melt surface to the pressure-reduced Ar gas atmosphere so as to be properly removed. Therefore, it is a fact that pinhole defects due to the generated SiO gas moving toward the lower portion of the single-crystal ingot under pulling along with the current of the silicon melt and being incorporated into the single-crystal ingot cannot be avoided.

SUMMARY OF THE INVENTION

To solve the above-mentioned problems, the invention provides a high-purity vitreous silica crucible used for pulling a large-diameter single-crystal silicon ingot. The high-purity vitreous silica crucible used for pulling a large-diameter single-crystal silicon ingot, includes a double layered structure constituted by an outer layer composed of high-purity amorphous vitreous silica with a bubble content of 1 to 10% and a purity of 99.99% or higher, and an inner layer composed of high-purity amorphous vitreous silica with a bubble content of 0.6% or less and a purity of 99.99% or higher, wherein, at least for an inner surface between ingot-pulling start line and ingot-pulling end line of a silicon melt surface, a longitudinal section of the inner surface is shaped into a waveform to be a multi ring-groove patterned face, and depth and width of the ring grooves constituting the multi ring-groove patterned face are set in the range of 0.5 to 2 mm and 10 to 100 mm, respectively, thereby reducing pinhole defects in the large-diameter single-crystal silicon ingot.

The vitreous silica crucible according to the invention is used for pulling a large-diameter single-crystal silicon having a diameter of 200 to 300 mm. Although the vitreous silica crucible is implemented to have a large outer diameter such as of 610 to 810 mm, the amount of generated SiO gas can be reduced. This is because the following phenomena occur in the vitreous silica crucible. First, in the ring grooves constituting the multi ring-groove patterned face formed on the inner surface of the crucible, SiO gas generated by the reaction between the inner surface of the large-diameter crucible and the silicon melt in a large amount according to the increase in diameter of the crucible accumulates. This SiO gas accumulation and the next generated SiO gas collect and stay until the gas accumulation grows to such a size that it is not influenced by convection of the silicon melt. At a time point when the generated SiO gas accumulation grows and has high buoyancy, the grown gas accumulation separates from the ring groove and goes straight on the silicon melt surface at once to be discharged to the pressure-reduced Ar gas atmosphere. Therefore, the amount of the generated SiO gas that moves to the lower portion of the single-crystal ingot under pulling along the silicon melt by the convection can be significantly reduces. As a result, pinhole defects generated in the single-crystal ingot can also be significantly reduced.

DETAILED DESCRIPTION OF THE INVENTION

The inventor, according to the above-mentioned aspects, has carried out research focusing on the behavior of an SiO gas generated from a silicon melt upon pulling a single-crystal ingot. As a result, research results as represented by the following (a) to (c) were obtained.

Figure 2A:
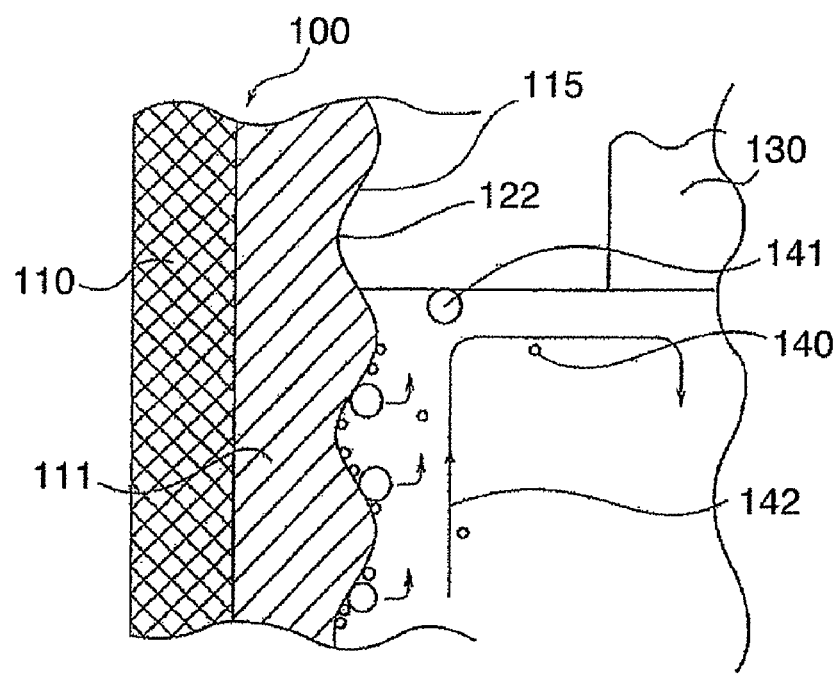
FIG. 2A is a longitudinal sectional view schematically illustrating a behavior of a generated SiO gas with regard to an inner surface of the main portion of the vitreous silica crucible according to the present invention.
Figure 2B:
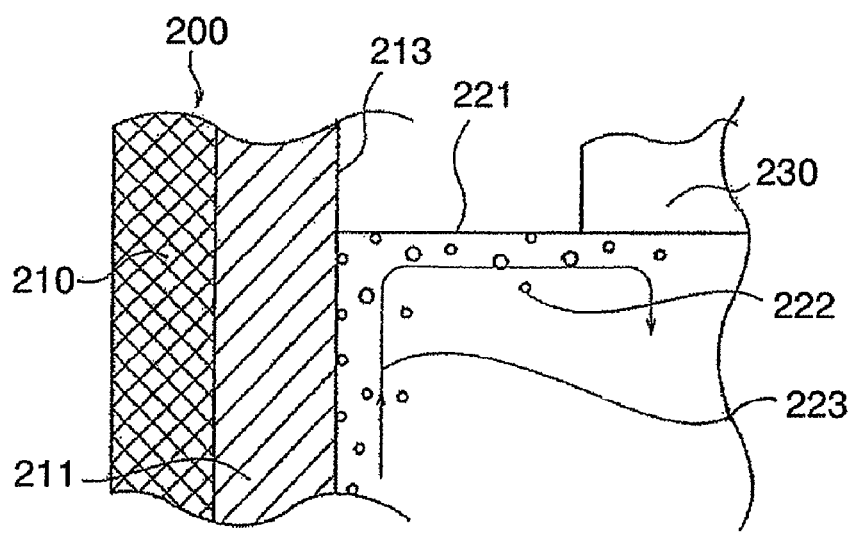
FIG. 2B is a longitudinal sectional view schematically illustrating a behavior of a generated SiO gas with regard to an inner surface of a main portion of a conventional vitreous silica crucible.

(a) In general, in a vitreous silica crucible 200 having an inner layer 211 and an outer layer 210 as illustrated in FIG. 2, a SiO gas 222 generated by reaction between a silicon melt 221 and an inner surface 213 of the vitreous silica crucible upon pulling a single-crystal ingot 230 has a diameter of 50 to 200 μm right after being generated. In addition, as schematically illustrated by the longitudinal sectional view of the main portion in FIG. 2B, the generated SiO gas 222 moves along the inner surface 213 of the crucible by silicon melt convection 223. Most of the SiO gas is discharged from a silicon melt 221 to the pressure-reduced Ar gas atmosphere while maintaining the diameter to be removed from the silicon melt. However, a little remaining generated SiO gas 222 moves to a lower portion of the single-crystal ingot 230 under pulling to be contained in the single-crystal ingot 230 and cause pinhole defects. In addition, the ratio of the generated SiO gas 222 contained in the single-crystal ingot 230 may significantly increase as the ingot and the crucible have larger diameters.

Figure 1A:
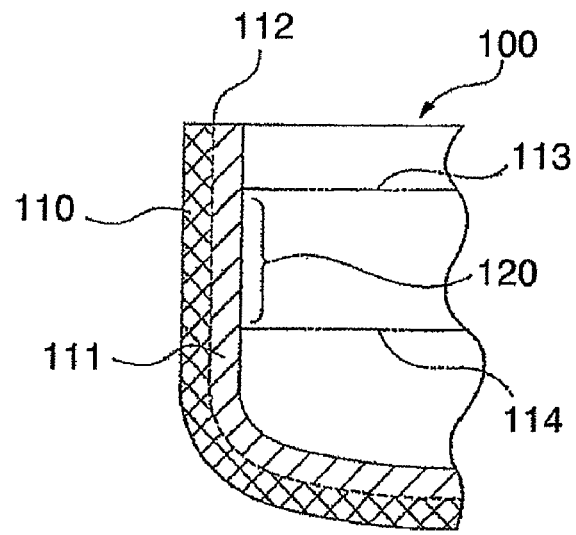
FIG. 1A is an overall longitudinal sectional view illustrating half of a vitreous silica crucible according to the invention.
Figure 1B:
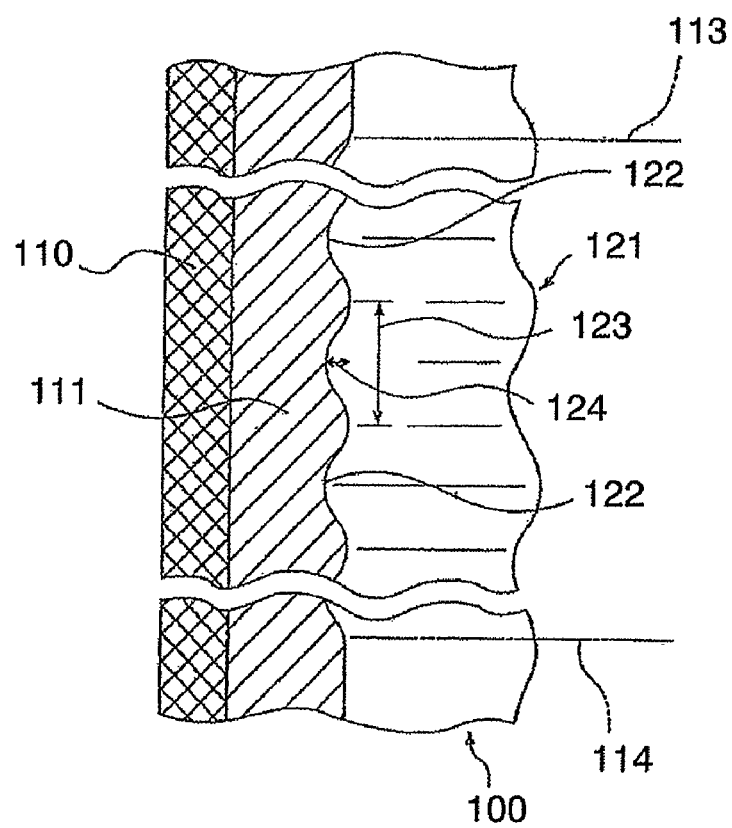
FIG. 1B is an enlarged longitudinal sectional view illustrating a main portion of the vitreous silica crucible between pulling start line and pulling end line according to the present invention.

(b) In a vitreous silica crucible 100 including an inner layer 111 and an outer layer 110 according to an embodiment of the invention illustrated by the longitudinal sectional views in FIG. 1A and FIG. 1B, with regard to an inner surface 115 of the vitreous silica crucible illustrated in FIG. 2, at least for the inner surface between ingot-pulling start line 113 and ingot-pulling end line 114 of a silicon melt surface, "a longitudinal section of the inner surface is shaped into a waveform to be a multi ring-groove patterned face (multi ring-groove patterned face 121)". In this structure, as schematically illustrated by the longitudinal sectional view of the main portion in FIG. 2A, the inside of the ring grooves 122 constituting the multi ring-groove patterned face serves as a retention zone so as not to be influenced by the current of the silicon melt. A SiO gas 140 generated at a lower portion of the crucible moves along with the current (referred to as silicon melt convection 142) of the silicon melt and the inner surface of the crucible into the ring groove. Next, in this retention zone, along with SiO gas generated inside the ring groove, the transferred SiO gas stays while attached to an inner surface of the ring groove. Next, SiO gas sequentially transferred into the ring groove and SiO gas sequentially generated inside the ring groove accumulate and grow. Thereafter, at a time point when the size of the accumulation 141 of the SiO gas increases to 500 to 900 μm, the accumulation has high buoyancy. Here, the accumulation 141 of the SiO gas separates from the ring groove and moves straight forward to the silicon melt surface without being influenced by the silicon melt convection 142 due to the high buoyancy to be discharged to the pressure-reduced Ar gas atmosphere. Therefore, in the vitreous silica crucible 100 having the aforementioned structure illustrated in FIGS. 1A and 1B, the SiO gas 140 that moves to the lower portion of the single-crystal ingot 130 under pulling along the silicon melt by the convection and causes pinhole defects can be significantly reduced. In addition, these phenomena do not tend to change although the diameters of the single-crystal ingot 130 and the vitreous silica crucible 100 are increased.

(c) An experiment of pulling a large-diameter single-crystal ingot with a diameter of 200 to 300 mm was performed by using a large vitreous silica crucible with an inner diameter of 610 to 810 mm. Here, experimental results showed that the generation of pinhole defects in the large-diameter single-crystal ingot is suppressed as much as possible when depth and width of the ring grooves constituting the multi ring-groove patterned face are set in the range of 0.5 to 2 mm and 10 to 100 mm, respectively.

In addition, FIGS. 1B and 2A illustrate the case in which the waveform of the longitudinal section of the inner surface of the vitreous silica crucible is a "sine wave". However, although the waveform is modified, when depth and width of the ring grooves are set in the aforementioned range, the same significant effects tend to be obtained.

Figure 4:
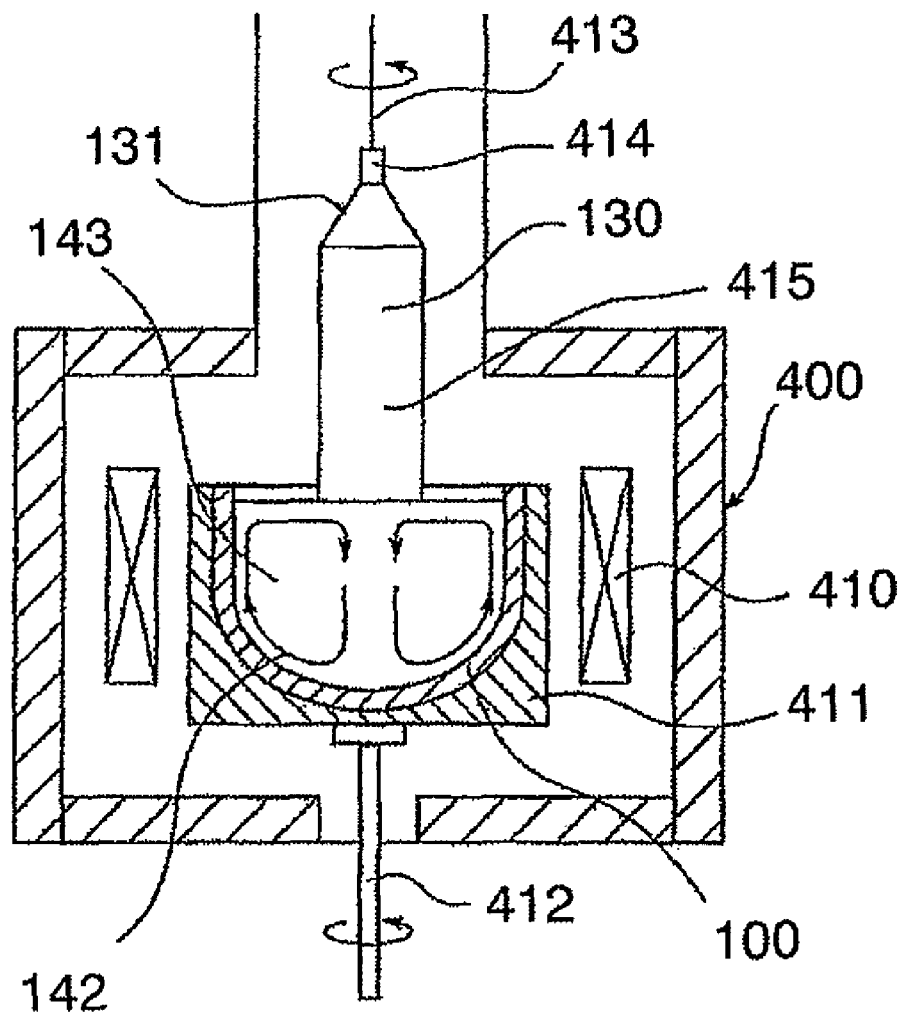
FIG. 4 is a longitudinal sectional view illustrating a single-crystal ingot under pulling.

The ingot-pulling start line 113 of the silicon melt surface illustrated in FIG. 1A is, as illustrated in FIG. 4, referred to as the height of the silicon melt 143 represented when single-crystal growth begins after the silicon melt 143 charged in the vitreous silica crucible 100 is heated by a heater 410 and a seed crystal 101 contacts the silicon melt 143 to pull the single-crystal silicon in the Czochralski method.

The ingot-pulling end line 114 of the silicon melt surface illustrated in FIG. 1A is referred to as the height of the silicon melt 143 represented when the formation of the single-crystal ingot 130 ends.

A groove width 123 illustrated in FIG. 1B is the distance between adjacent peaks of the ring grooves 122 (ring-shaped concave portions).

A groove depth 124 of the multi ring-groove patterned face illustrated in FIG. 1B is the length of the longest line among lines extending toward the ring groove to be perpendicular to a line connecting adjacent peaks of the ring grooves 122 (ring-shaped concave portions).

The invention is based on the research results and provides a high-purity vitreous silica crucible used for pulling a large-diameter single-crystal silicon ingot, including a double layered structure constituted by an outer layer composed of high-purity amorphous vitreous silica with a bubble content of 1 to 10% and a purity of 99.99% or higher, and an inner layer composed of high-purity amorphous vitreous silica with a bubble content of 0.6% or less and a purity of 99.99% or higher, wherein, with regard to an inner surface of the high-purity vitreous silica crucible, at least for the inner surface between ingot-pulling start line and ingot-pulling end line of a silicon melt surface, (a) a longitudinal section of the inner surface is shaped into a waveform to be a multi ring-groove patterned face, and (b) depth of the ring grooves constituting the multi ring-groove patterned face is set in the range of 0.5 to 2 mm and width of the ring grooves constituting the multi ring-groove patterned face is set in the range of 10 to 100 mm, respectively. The vitreous silica crucible enables reduction of the pinhole defects in a large-diameter single-crystal ingot.

Purity represents the ratio of Si to the whole vitreous silica crucible. In addition, "%" of the purity is "mass %". When the purity is 99.99% or higher, the vitreous silica crucible can be used for pulling a single-crystal silicon ingot for semiconductors.

The bubble content of the outer layer of the vitreous silica crucible is equal to or more than 1% and equal to or less than 10%, and more preferably, equal to or more than 1% and equal to or less than 5%. When the bubble content of the outer layer is less than 1%, the infrared transmittance rises and the silicon melt is heated directly. Therefore, it is difficult to control the temperature of the silicon melt. In addition, when the bubble content of the outer layer is higher than 10%, the vitreous silica crucible bloat and the height of the silicon melt surface change. Therefore, it is difficult to control the operation when single-crystal silicon ingot is pulling.

The bubble content of the inner layer of the vitreous silica crucible is 0.6% or less, and more preferably, 0.2% or less. The less the bubble content of the inner layer is, the more it is preferable.

When the bubble content of the inner layer of the vitreous silica crucible is higher than 0.6%, the bubble in the inner layer is opened in the silicon melt when the inner layer surface fuses. At that time, small pieces of the vitreous silica may be exfoliated from the inner surface of the crucible due to the opening of the bubbles and may falls in the silicon melt, single-crystal silicon ingot may be have the dislocation by the pieces of the vitreous silica that occur at the time of evolved the bubble.

In addition, "%" representing the bubble content is "volume %" of bubbles to the vitreous silica crucible.

The groove depth is equal to or more than 0.5 mm and equal to or less than 2 mm, preferably, equal to or more than 1 mm and equal to or less than 2 mm, and more preferably, equal to or more than 1 mm and equal to or less than 1.5 mm. When the groove depth is not in the aforementioned range, pinholes easily occur in the single-crystal ingot, and a desired single-crystal ingot cannot be easily obtained.

The groove width is equal to or more than 10 mm and equal to or less than 100 mm, preferably, equal to or more than 10 mm and equal to or less than 50 mm, and more preferably, equal to or more than 10 mm and equal to or less than 30 mm. When the groove width is not in the range, pinholes easily occur in the single-crystal ingot, and a desired single-crystal ingot cannot be easily obtained.

The depth and the width of the ring grooves constituting the multi ring-groove patterned face of the vitreous silica crucible according to the invention are set on the basis of various experimental results as described above. Therefore, when the depth and the width of the ring grooves satisfy the aforementioned numerical conditions, generation of pinhole defects in the large-diameter single-crystal ingot can be sufficiently reduced. When any one of the depth and the width of the ring grooves is not in the set numerical range, the desired effects of reduction of pinhole effects in the large-diameter single-crystal ingot cannot be obtained.

The vitreous silica crucible according to the invention is used for pulling a large-diameter single-crystal ingot with a diameter of 200 to 300 mm. The vitreous silica crucible can be implemented to have a large outer diameter such as of 610 to 810 mm. This can be achieved for the following reasons. First, in the ring grooves constituting the multi ring-groove patterned face formed on the inner surface of the crucible, SiO gas generated by the reaction between the inner surface of the large-diameter crucible and the silicon melt in a large amount according to the increase in diameter of the crucible accumulates. This SiO gas accumulation and the next generated SiO gas collect and stay until the gas accumulation grows to such a size that it is not influenced by the convection of the silicon melt. At a time point when the generated SiO gas accumulation grows and has high buoyancy, the grown gas accumulation separates from the ring groove and goes straight on the silicon melt surface to be discharged to the pressure-reduced Ar gas atmosphere. Therefore, the amount of the generated SiO gas that moves to the lower portion of the single-crystal ingot under pulling along the silicon melt by the convection can be significantly reduced. As a result, significant effects such as significant reduction of pinhole defects generated in the single-crystal ingot can be obtained.

Method of Manufacturing Vitreous Silica Crucible

As a raw powder (vitreous silica powder) of the vitreous silica crucible, vitreous silica powder may be used. Here, the "vitreous silica powder" is not limited to quartz and any material including silicon dioxide (silica) may be employed. The material including silicon dioxide does not need to be crystal. Specifically, as the vitreous silica powder, powder of a well-known material such as crystal, silicon sand, natural quartz powder, synthetic fused silica powder, and the like may be used as a raw material of the vitreous silica crucible.

In the method of manufacturing the vitreous silica crucible according to the invention, as illustrated in FIG. 3, a crucible manufacturing apparatus 300 with a rotating mold 310 for performing vacuum creation 311 is used.

The silica glass crucible manufacturing apparatus 300 is constituted by, as illustrated in FIG. 3, the mold 310 which has a melting space in the inner part for melting the vitreous silica powder and forming a vitreous silica crucible, a driving mechanism not shown in the figure which rotates the mold 310 on the axis, and a plurality of carbon electrodes 312 which serve as arc discharge means for heating the inner side of the mold 310. The mold 310 is formed of, for example, carbon, and a number of pressure-reducing passages 313 which are open to the surface of the inner part of the mold 310 are formed inside. The pressure-reducing passage 313 is connected with a pressure-reducing mechanism which thus allows a suction of air from the inner side of the mold 310 via the pressure-reducing passage 313 at the time of rotating the mold 310. On the inner surface of the mold 310, pressure-reduction or pressurization is performed by atmosphere pressure control means not shown to set an atmosphere pressure.

The plurality of electrodes 312 is provided as the arc discharge means at an upper side of the mold 310 of the vitreous silica crucible manufacturing apparatus 300. In the example illustrated in the figure, the electrodes 312 are formed in combination of three electrodes. The electrodes 312 are fixed to a support at the upper part of a furnace not shown, and the support is provided with means (not shown) for vertically moving the electrodes 312.

The support includes a supporting part for supporting the carbon electrodes 312 while allowing setting distances between the electrodes, horizontally transferring means that allows the supporting part to move in a horizontal direction, and vertically transferring means that allows the plurality of supporting parts and the respective horizontally transferring means to move integrally in a vertical direction. The supporting part includes rotation means that controls a rotation angle of the carbon electrodes 312.

After accumulating the vitreous silica powder (the high-purity vitreous silica powder 315), by using the arc electrodes 312 provided above the mold space, the vitreous silica powder is heated, melted, and vitrified. Here, during melting, the pressure-reducing mechanism sucks bubbles from the inner surface by performing vacuum creation through the pressure-reducing passages 313, thereby forming a transparent glass layer. After vitrifying, the vitreous silica is cooled and taken from the mold, thereby obtaining the vitreous silica crucible 100.

In the method of manufacturing the vitreous silica crucible according to the invention, vitreous silica powder for an outer layer is supplied on the inner surface of the rotating mold 310 to be deposited to a predetermined thickness. Thereafter, vitreous silica power for an inner layer is supplied on the vitreous silica powder for the outer layer to be deposited to a predetermined thickness thereby forming a vitreous silica powder compact.

In this case, as compared with the vitreous silica powder for the inner layer, powder which easily generates microbubbles when heated is used as the vitreous silica powder for the outer layer.

Figure 3A:
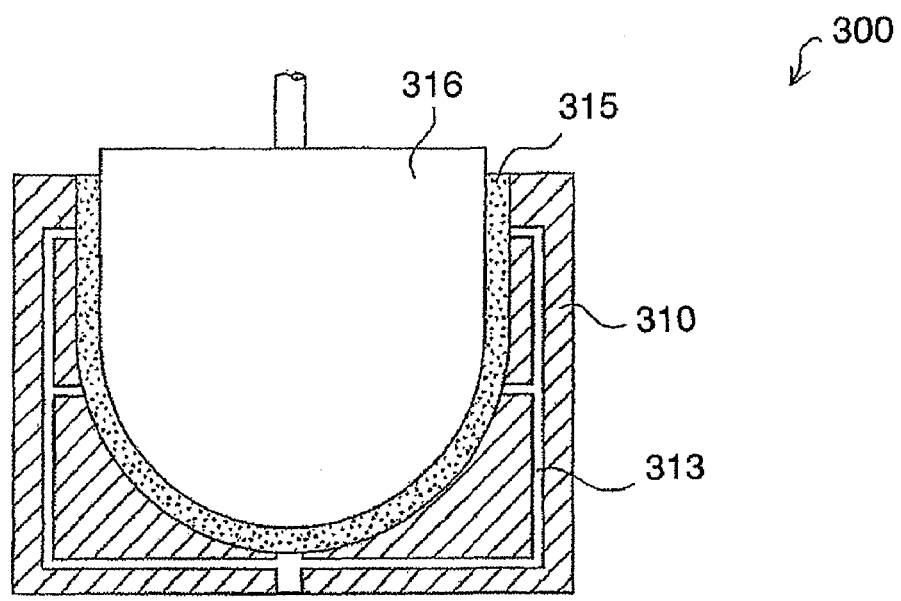
FIG. 3A is a longitudinal sectional view illustrating a raw powder filled in a manufacturing process of a vitreous silica crucible.

In the method of manufacturing the vitreous silica crucible according to the invention, as illustrated in FIG. 3A, the vitreous silica powder may be supplied by using a method of charging the vitreous silica powder into a gap formed between the outer surface of the core 316 and the inner surface of the mold 310.

After charging the vitreous silica powder, arc melting is performed by using the arc discharge 320 in a state where an electrode center and a mold rotation center are aligned with each other, thereby manufacturing the vitreous silica crucible.

After manufacturing the vitreous silica crucible, a multi ring-groove patterned face is formed on the inner surface of the crucible between the ingot-pulling start line and the ingot-pulling end line of the vitreous silica crucible as illustrated in FIG. 1A according to the invention. The multi ring-groove patterned face may be formed by performing a grinding process, for example, using a sand blast. In addition, on the surface subjected to the grinding process, a smoothing process may be performed by using oxygen banner as a finishing process.

The method of forming the multi ring-groove patterned face is not limited to the above-mentioned method, and any method capable of obtaining groove width and groove depth in the predetermined range according to the invention may be used.

For example, before performing the arc melting, the multi ring-groove pattern may be formed on the inner surface of the deposition of the vitreous silica powder in advance.

Method of Manufacturing Single-Crystal Ingot

Figure 5:
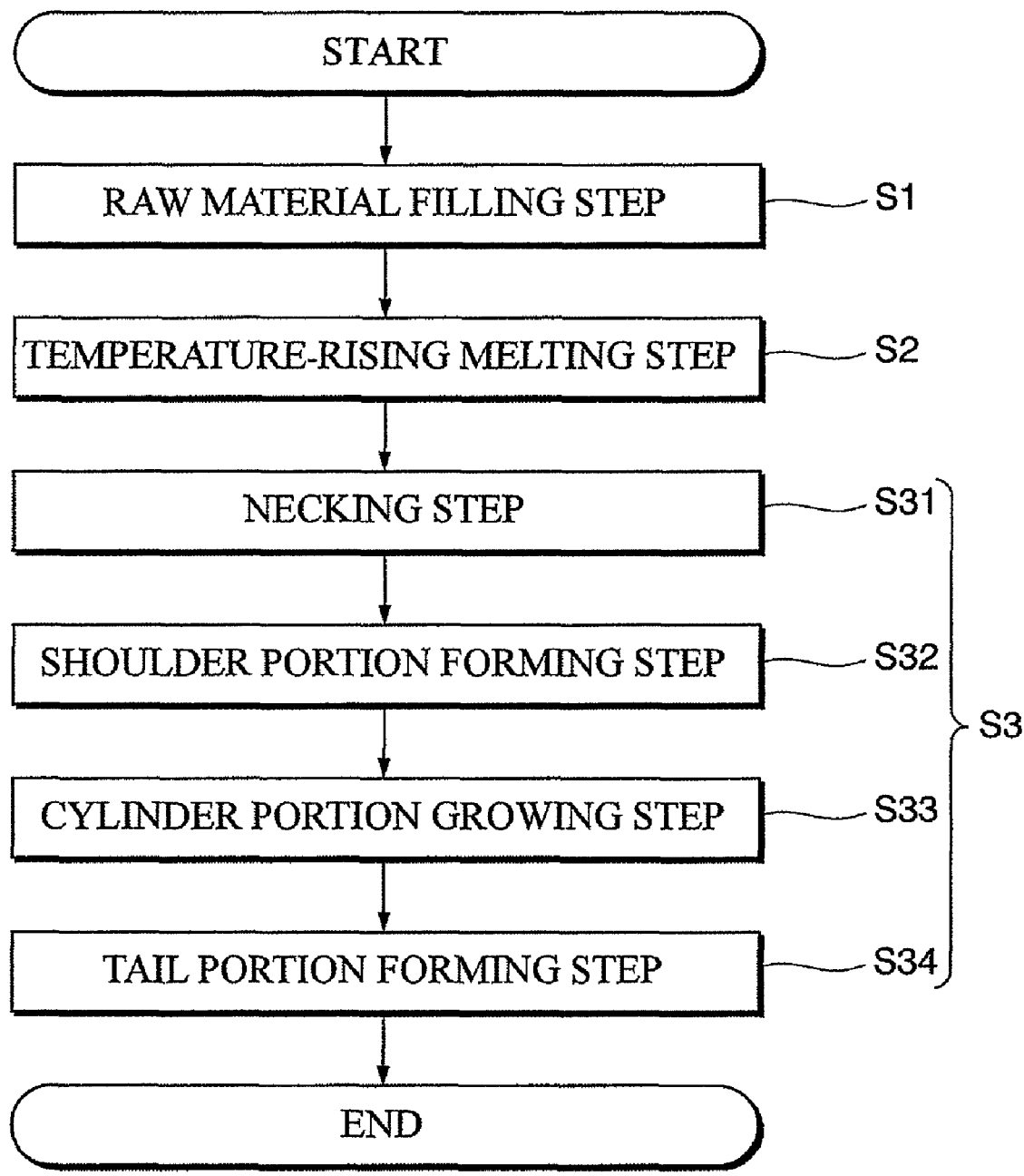
FIG. 5 is a flowchart of a process for pulling the single-crystal ingot.

FIG. 5 is a flowchart of a process for pulling a single-crystal ingot using the vitreous silica crucible according to an embodiment of the invention. FIG. 4 is a front view illustrating the process for pulling the single-crystal silicon using the vitreous silica crucible according to the invention.

The pulling of the single-crystal silicon using the vitreous silica crucible 100 according to the embodiment may use, for example, the Czochralski method.

The method of pulling the single-crystal silicon includes, as illustrated in FIG. 5, a raw material filling step S1, a temperature-rising melting step S2, and a pulling step S3 including a necking step S31, a shoulder portion forming step S32, a cylinder portion growing step S33, and a tail portion forming step S34 of reducing the diameter of the cylinder to separate the single-crystal from the melt.

In the raw material filling step S1, polysilicon mass as the raw material is filled in the vitreous silica crucible 100.

In the temperature-rising melting step S2, the vitreous silica crucible 100 filled with the raw material is placed inside a single-crystal pulling apparatus 400 illustrated in FIG. 4. Thereafter, pressure of the atmosphere inside the single-crystal pulling apparatus 400 is set in the range of, for example, 1.33 to 26.66 kPA (10 to 200 torr) as a melting pressure. Additionally, for example, the melting step atmosphere condition is maintained as an inert gas atmosphere such as an Ar gas atmosphere or the like. In addition, temperature is increased by the heating means (heater) 410 illustrated in FIG. 4 from room temperature to a pulling temperature of 1,400 to 1,550° C. for 5 to 25 hours. The pulling temperature is maintained for 10 hours to melt the polysilicon mass to be converted into the silicon melt 143.

Thereafter, in the pulling step S3, a pulling atmosphere condition is set to be the same as the melting step atmosphere condition or a predetermined pulling atmosphere condition. In addition, a seed crystal (single-crystal silicon) 414 is dipped into the silicon melt 143, the vitreous silica crucible 100 is rotated on a rotating shaft 412, and the seed crystal 414 is then pulled slowly by using a pulling wire 413. From the seed crystal 414, a single-crystal silicon is grown.

Here, a necking portion is formed in the necking step S31 to exclude the dislocation content caused by heat impact from the crystal surface. Thereafter, in the shoulder portion forming step S32, by increasing the diameter of the necking portion, a shoulder portion 131 is formed. Thereafter, in the cylinder portion growing step S33, a single-crystal silicon having a cylinder portion 415 from which silicon wafers are obtained is grown. Thereafter, in the tail portion forming step S34, the diameter is decreased to separate the single-crystal from the melt.

The ingot-pulling start line of the silicon melt surface described in the invention is the position of the silicon melt surface represented when the seed crystal (single-crystal silicon) 414 is dipped into the silicon melt 143, that is, when the pulling step S3 is started. In addition, the ingot-pulling end line of the silicon melt surface is the position of the silicon melt surface represented when the single-crystal is separated from the melt, that is, when the pulling step S3 is ended.

The initial stage, for example, is the stage from the temperature-rising melting step S2 in which the polysilicon mass of the raw material is melted till the end of the necking step S31. More specifically, it is, for example, a stage from the start of maintaining the pulling temperature state till 20 hours after the maintenance.

The stage coming after the initial stage is, for example, a stage from the end of the necking step S31 till the end of the cylinder portion growing step S33 of the pulling step S3, that is, before the start of the tail portion forming step S34. More specifically, it is, for example, a stage from 20 hours after the maintenance of the pulling temperature state till 100 hours thereafter.

Next, Examples of the vitreous silica crucible of the invention are described in detail.

Figure 3B:
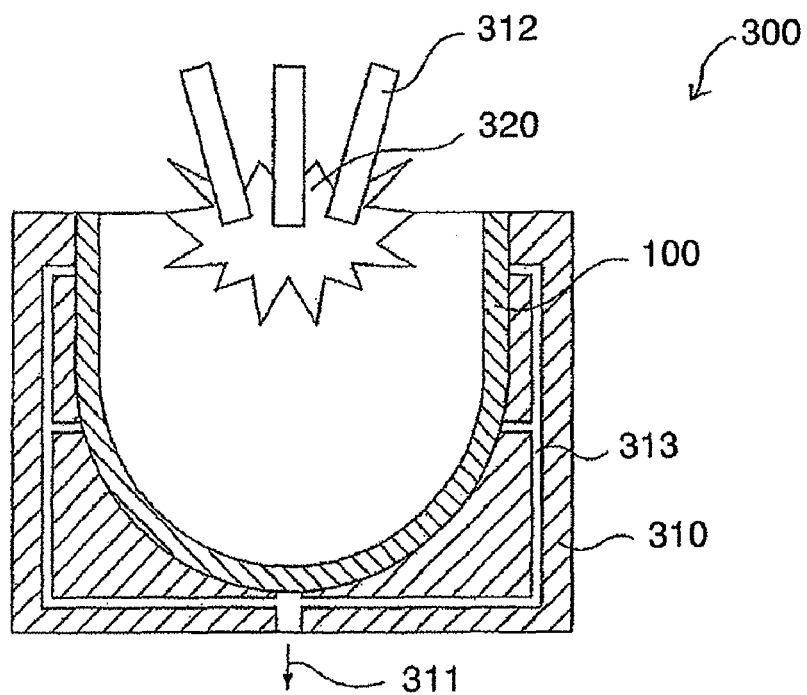
FIG. 3B is a longitudinal sectional view illustrating the vitreous silica crucible molten and shaped in the manufacturing process of the vitreous silica crucible.

According to the manufacturing process illustrated in FIGS. 3A and 3B, in normal conditions, a vitreous silica crucible (hereinafter, referred to as crucible material A) used for pulling a single-crystal ingot with a diameter of 200 mm was created. The crucible material A has an outer diameter of 610 mm, a depth of 380 mm, and a thickness of 19 mm. The ingot-pulling start line of the silicon melt surface of the crucible material A is at a position of 50 mm from the open upper end (open upper end 112 illustrated in FIG. A). The ingot-pulling end line of the crucible material A is at a position of 100 mm from the open upper end. The crucible material A has a double layered structure constituted by an outer layer composed of high-purity amorphous vitreous silica with a bubble content of 5%, a purity of 99.994%, and a thickness of 6 mm, and an inner layer composed of high-purity amorphous vitreous silica with a bubble content of 0.3%, a purity of 99.998%, and a thickness of 4 mm. By performing the manufacturing process illustrated in FIGS. 3A and 3B, in normal conditions, a vitreous silica z crucible (hereinafter, referred to as crucible material B) used for pulling a single-crystal ingot with a diameter of 300 mm was created.

The crucible material B has an outer diameter of 810 mm, a depth of 435 mm, and a thickness of 16 mm. The ingot-pulling start line of the silicon melt surface of the crucible material B is at a position of 100 mm from the open upper end. The ingot-pulling end line of the crucible material B is at a position of 335 mm from the open upper end. The crucible material B has a double layered structure constituted by an outer layer composed of high-purity amorphous vitreous silica with a bubble content of 5%, a purity of 99.997%, and a thickness of 10 mm, and an inner layer composed of high-purity amorphous vitreous silica with a bubble content of 0.2%, a purity of 99.998%, and a thickness of 6 mm.

The crucible materials A and B were each manufactured.

Next, a ring-groove pattern was formed on the inner surface of each of the crucible materials A and B between the ingot-pulling start line and the ingot-pulling end line of the silicon melt surface. Groove depth and groove width of the ring grooves were set as represented by Table 1, and a longitudinal section of the inner surface was shaped into a sine waveform. This multi ring-groove patterned face was formed by performing a grinding process. On the surface subjected to the grinding process, a smoothing process was performed by using oxygen banner as a finishing process. In the aforementioned method, vitreous silica crucibles 1 to 16 of the invention and comparative vitreous silica crucibles 1 to 10 were manufactured. Here, 5 samples were manufactured for each of the vitreous silica crucibles.

The comparative vitreous silica crucibles 1 and 6 refer to conventional vitreous silica crucibles without the multi ring-groove patterned face. The comparative vitreous silica crucibles 2 to 5 and 7 to 10 were manufactured so that any one of groove depth and groove width of ring grooves constituting the multi ring-groove patterned faces is not in the range of the invention. The depth and width of the ring grooves was measured using a slide caliper.

Next, by using the vitreous silica crucibles 1 to 16 of the invention and the comparative vitreous silica crucibles 1 to 10 each of which has 5 samples, the pulling apparatus illustrated in FIG. 4 manufactured single-crystal ingots with diameters of 200 and 300 mm in normal conditions. In this case, for each of the vitreous silica crucibles 1 to 16 of the invention and the comparative vitreous silica crucibles 1 to 10, 5 single-crystal ingots were manufactured. Here, 1,000 wafers with a thickness of 725 μm were cut from a single-crystal ingot with a diameter of 200 mm. In addition, 800 wafers with a thickness of 775 μm were cut from a single-crystal ingot with a diameter of 300 mm. Upper and lower surfaces of the wafers cut from each of the 5 single-crystal ingots were tested by using a visual inspection and a conventional inspection apparatus of contaminants. In addition, the wafer having a concave of 30 μm more in diameter is determined as a pinhole-containing wafer, and the number of pinhole-containing wafers is represented in Table 1.

[Table 1]

According to the results represented in Table 1, it is apparent that although the single-crystal ingot has a large diameter such as of 200 to 300 mm, when the vitreous silica crucibles 1 to 16 of the invention are used, few pinhole defects in the single-crystal ingot occur. This is because the preferable multi ring-groove patterned face is formed on the inner surface of the crucible between the ingot-pulling start line and the ingot-pulling end line of the silicon melt surface. On the other hand, it is apparent that in the comparative vitreous silica crucibles 1 and 6 without the multi ring-groove patterned face, and in the single-crystal ingots pulled by using the comparative vitreous silica crucibles 1 and 6 (corresponding to the conventional vitreous silica crucibles), pinhole defects occur at a significant ratio. In addition, it is apparent that although the comparative vitreous silica crucibles 2 to 8 are provided with the multi ring-groove patterned face, when any one of groove depth and groove width of the ring grooves constituting the multi ring-groove patterned faces of the comparative vitreous silica crucibles 2 to 8 is not in the range of the invention and the single-crystal ingots are pulled by using the comparative vitreous silica crucibles 2 to 8, pinhole defects occur in the single-crystal ingots under pulling at a significant ratio.

As described above, the vitreous silica crucible of the invention is proper for pulling the large-diameter single-crystal ingot particularly with a diameter of 200 to 300 mm, and can contribute to an increase in yield and quality of large-diameter single-crystal silicon wafers.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

TABLE 1

| Type | Crucible Material No. | Ring Groove Size (mm) | | The Number of Wafers with Pinhole |
| --- | --- | --- | --- | --- |
| | | Groove Depth | Groove Width | |
| Vitreous Silica Crucible of Invention | 1 | (A) | 0.5 | 50 | 18 |
| | 2 | (A) | 1 | 50 | 18 |
| | 3 | (A) | 1.5 | 50 | 16 |
| | 4 | (A) | 2 | 50 | 14 |
| | 5 | (A) | 1 | 10 | 17 |
| | 6 | (A) | 1 | 30 | 15 |

TABLE 1-continued

| Type | Crucible Material No. | Ring Groove Size (mm) Groove Depth | Groove Width | The Number of Wafers with Pinhole |
|---|---|---|---|---|
| | 7 | (A) | 1 | 70 | 16 |
| | 8 | (A) | 1 | 100 | 18 |
| | 9 | (B) | 0.5 | 50 | 18 |
| | 10 | (B) | 1 | 50 | 16 |
| | 11 | (B) | 1.5 | 50 | 16 |
| | 12 | (B) | 2 | 50 | 14 |
| | 13 | (B) | 1 | 10 | 17 |
| | 14 | (B) | 1 | 30 | 16 |
| | 15 | (B) | 1 | 70 | 15 |
| | 16 | (B) | 1 | 100 | 17 |
| Comparative Vitreous Silica Crucible | 1 | (A) | —* | —* | 32 |
| | 2 | (A) | 0.3* | 50 | 25 |
| | 3 | (A) | 2.5* | 50 | 23 |
| | 4 | (A) | 1 | 5* | 27 |
| | 5 | (A) | 1 | 120* | 26 |
| | 6 | (B) | —* | —* | 29 |
| | 7 | (B) | 0.3* | 50 | 28 |
| | 8 | (B) | 2.5* | 50 | 23 |
| | 9 | (B) | 1 | 5* | 21 |
| | 10 | (B) | 1 | 120* | 22 |

(*represents a degree past the range of the invention)

The invention claimed is:

1. A vitreous silica crucible for pulling a single-crystal silicon ingot, comprising a double layered structure constituted by an outer layer composed of high-purity amorphous vitreous silica with a bubble content of 1 to 10% and a purity of 99.99% or higher, and an inner layer composed of high-purity amorphous vitreous silica with a bubble content of 0.6% or less and a purity of 99.99% or higher,
wherein, with regard to an inner surface of the high-purity vitreous silica crucible, at least for the inner surface between ingot-pulling start line and ingot-pulling end line of a silicon melt surface,
(a) a longitudinal section of the inner wall surface is in the shape of the wave to be a multi ring-groove patterned face, and
(b) depth of the ring grooves constituting the multi ring-groove patterned face is set in the range of 0.5 to 2 mm and width of the ring grooves constituting the multi ring-groove patterned face is set in the range of 10 to 100 mm, respectively, such that pinhole defects in the large-diameter single-crystal silicon ingot are reduced.

2. The vitreous silica crucible of claim 1, wherein the vitreous silica crucible has an outer diameter of 610 to 810 mm.

* * * * *